Aug. 7, 1956 B. PARZEN 2,758,207

VARIABLE FREQUENCY OSCILLATOR

Filed Nov. 27, 1951

INVENTOR
BENJAMIN PARZEN
BY Percy P. Lantzy
ATTORNEY

United States Patent Office 2,758,207

Patented Aug. 7, 1956

2,758,207

VARIABLE FREQUENCY OSCILLATOR

Benjamin Parzen, Forest Hills, N. Y., assignor to International Telephone and Telegraph Corporation, a corporation of Maryland Application November 27, 1951, Serial No. 258,354

5 Claims. (Cl. 250—36)

This invention relates to oscillators and more particularly to oscillators capable of convenient, variable, and precise adjustment.

In many applications it is desirable that an oscillator be capable of being easily set to a predetermined desired frequency within a given range. Usually, such oscillators have used variable impedance elements to accomplish this purpose. This usual method requires accurate and individual calibration of the variable impedance elements and thus hinders the mass production of such oscillators. In addition, such a system would usually require specially designed impedance elements not readily obtainable.

One of the objects of this invention, therefore, is to provide a variable frequency selective oscillator which overcomes the aforementioned objections.

Another object of this invention is to provide a variable oscillator that can be set to a predetermined frequency easily and conveniently.

A further object of this invention is to provide an oscillator whose frequency can be varied in equal frequency steps by the use of equal inductance increments.

Still a further object of this invention is to provide a variable frequency oscillator that is relatively simple to build.

Briefly, in this invention a variable frequency electron coupled Hartley oscillator is provided which operates over a wide frequency range. The frequency is varied by switching, in steps of 1 kc., 100 cycles per second, 10 cycles per second, and selectively adjustable over a 10 cycle range. To vary the frequency in 1 kc. steps, equal inductance increments are added in series to the tank circuit inductance, and a capacitance is added in parallel with the tank circuit capacitance. The 100 cycle per second step and the 10 cycle per second step add inductance increments in series with the tank circuit inductance. A variable inductance coupled in series relation with the tank circuit inductance is provided to vary the operating frequency of the oscillator over a 10 cycle range. Thus, the positioning of three stepping switches and a selective variable inductance determine the operating frequency of the oscillator over a relatively wide range. The output at the plate is filtered by a double tuned circuit which prevents undesirable frequency responses in the output.

The above-mentioned and other features and objects of this invention and the manner of attaining them will become more apparent by reference to the following description taken in conjunction with the accompanying drawings, wherein.

Figure 1:
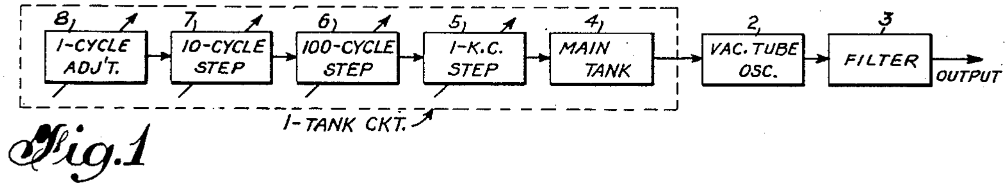
Fig. 1 shows in block schematic form an embodiment of this invention.

Referring to Fig. 1, a variable frequency oscillator is shown comprising a tank circuit 1, a vacuum tube oscillator 2, and an output filter 3. The tank circuit 1 comprises a main tank 4 and four frequency step controls 5, 6, 7, and 8. A 1 kc. step adjustment 5 changes the main tank 4 resonant frequency in 1 kc. steps by changing the impedance characteristics of the main tank 4 prerequisite amounts. In a similar manner, the main tank resonant frequency is changed in steps of 100 cycle per second and 10 cycle per second, respectively, by step adjustments 6 and 7. Control 8 provides for adjustment of the main tank resonant frequency over a 10 cycle range. Thus, by proper adjustment of the four controls 5–8, the main tank resonant frequency can be precisely adjusted over a frequency range.

Figure 2:
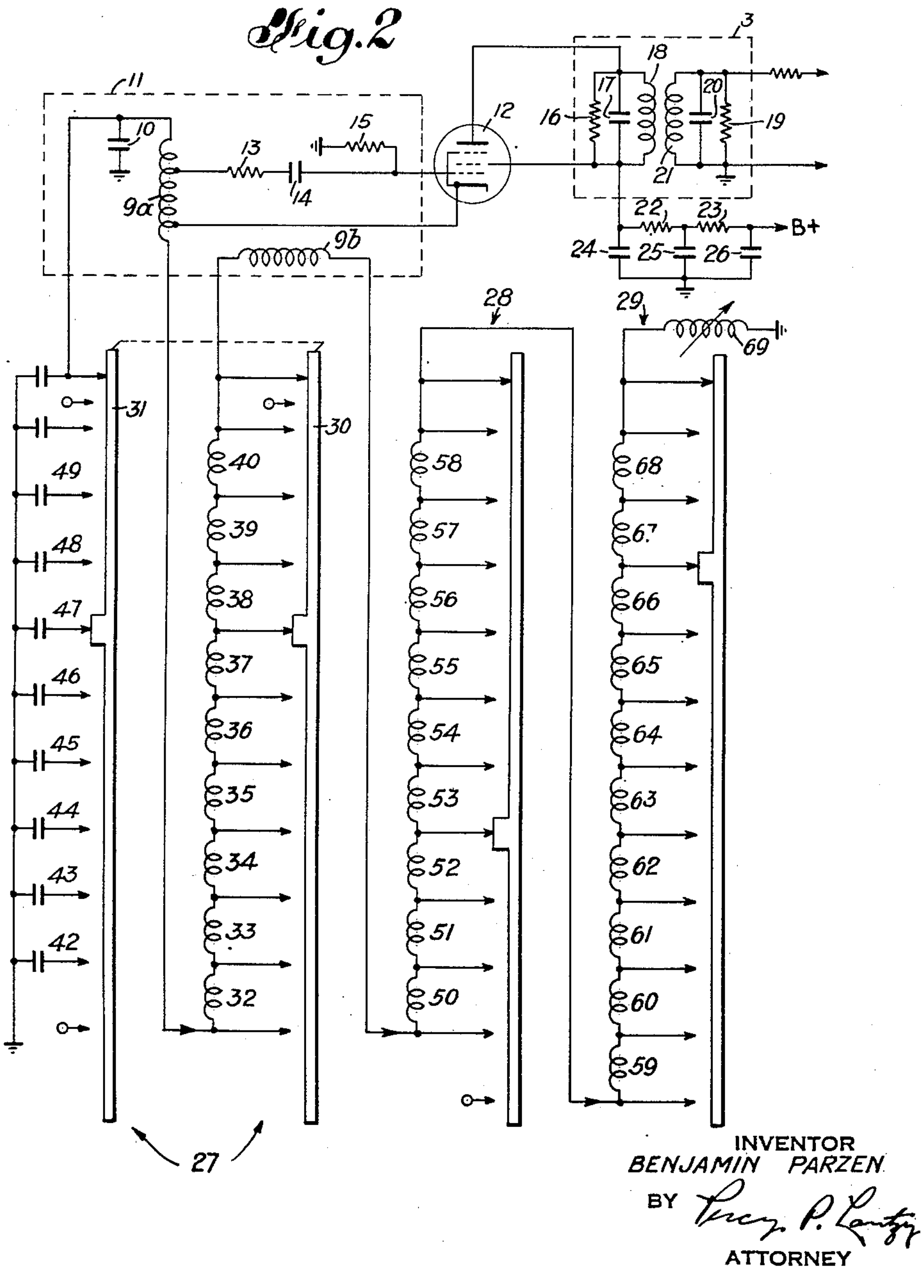
Fig. 2 is a schematic diagram showing the embodiment in more detail.

Referring to Fig. 2, a variable frequency oscillator according to the principles of this invention is shown wherein the main tank circuit 4 comprises an inductance $9^a$ and $9^b$ and a capacitance 10 in parallel. For increased stability the main tank circuit 4 is enclosed in a temperature compensated oven 11. The main tank is coupled between the control grid and cathode of an electron discharge device 12, preferably of the pentode type, through a parasitic suppressor 13 and a coupling capacitance 14. The suppressor grid of vacuum tube 12 is connected in the usual manner to the cathode thereof. Resistor 15 is a grid leak resistor. The output of the vacuum tube 12 is taken between the anode and screen grid and is fed to a double tuned filter circuit 3. The first filter section comprises a filter loading resistor 16, a filter tuning capacitance 17, and a tuning inductance 18. The second filter section likewise comprises a resistor 19, a capacitance 20, and an inductance 21. The source of power is filtered by means of resistors 25 and 26. For changing the resonant frequency of the main tank, three decade switches 27, 28, and 29 are provided. The first decade switch comprises an inductance switching wafer 30 and a capacitance switching wafer 31. Switch 27 varies the resonant frequency by coupling equal inductive increments 32–40 additively in series relation with the main tank inductance 9, and one of the capacitances 41–49, dependent on the number of inductive increments added, in parallel relation with the main tank capacitance 10. In series with the first decade switch is an inductance element *9b* which forms part of the main tank inductance 9 and a second decade step switch 28. Switch 28 couples equal additional inductive increments 50–58 additively in series relation with the inductive increments coupled by switch 27 and the main tank inductance 9. In series with switches 27 and 28 and main tank inductance 9 is a third step switch 29 which in a similar manner couples equal supplemental inductive increments 59–68 in series relation with the main tank inductance and any inductive increments coupled by switches 27 and 28. A variable inductance 69 which preferably is calibrated is connected in series with the main tank inductance 9 for a manual adjustment to vary the resonant frequency of the oscillator over a 10 cycle range. Thus, by setting the three decade step switches 27, 28, and 29 and by adjusting the variable inductance 69, any predetermined oscillating frequency within the oscillator's frequency range can be provided.

The highest frequency at which the oscillator will operate is determined by the impedance characteristics of inductance 9 and capacitance 10 of the main tank 4. To illustrate the operation of this oscillator, assume the main tank 4 has a resonant frequency of 100 kc. A convenient value may then be chosen, such as 10 $\mu$h., for the impedance of each of the equal inductance increments 32–40. The operating frequency of the oscillator is reduced by 1 kc. for each inductance increment of 10 $\mu$h. that is added in series with the main tank inductance 9, and simultaneously the necessary capacitance increment 41–49 that is necessary is coupled in parallel with the main tank capacitance 10. A decade switch 27 having an inductance wafer 30 and a capacitance wafer 31 is used to add the proper capacitance in parallel with the main tank capacitance 10 depending upon the number of equal inductance increments 32–40 that are added to the main tank inductance 9.

To reduce the operating frequency of the oscillator, as determined by the impedance added by switch 27 to the main tank impedance, by 100 C. P. S. in 10 steps, it is necessary to add in series with the main tank inductance 9 and the inductance increments added by switch 27 additional inductance increments of the value of 1 $\mu$h. for each step. A given change in inductance does not produce the same change in frequency, but when the inductance increment is quite small compared to the total inductance of the tank circuit, as it is for changes of 100 C. P. S., the difference between the actual changes in frequency in a constant value of 100 C. P. S. is so small as to be negligible for all practical purposes. Therefore, by making the additional inductance increments 50–58 equal, substantially constant 100 C. P. S. changes in operating frequency are obtained for each additional inductance increments 50–58 that are added to the main tank inductance and the inductance added by switch 27, dependent on the position of switch 27 and without the necessity of introducing additional capacitance in parallel with main tank capacitance 10 and the capacitance increment introduced by switch 27.

In a similar manner switch 29 couples equal supplemental inductance increments 59–68 in series with the main tank inductance 9 and any inductance added by switches 27 or 28 to reduce the operating frequency of the oscillator in 10 C. P. S. steps. Each supplemental inductance element 59–68 has an inductance equal to 1/10 the value of the inductance of an additional inductance increment 50–58.

Variable inductance 69 provides a selective adjustment variation of the operating frequency up to a maximum of 10 C. P. S. without the necessity of coupling any additional capacitance to the main tank capacitance 10 and thus the variable inductance 69 can be directly calibrated with a dial to give a fixed linear frequency indication for any fixed linear inductance variation.

If switches 27–29 be calibrated directly in frequency, any predetermined frequency may be set by manipulating the four switches; for example, when switches 27–29 are in the positions as shown in Fig. 2, the oscillator will operate at 93.620 kc.

Since the oscillator will operate from 90 to 100 kc., the output filter 3 must pass this wide frequency band while filtering out any undesirable frequency from the output. This requirement necessitates the use of a double tuned filter circuit which is capable of passing a wide frequency band while rejecting undesired frequencies. The double tuned filter comprises two filter sections each capable of being tuned by means of a coupling inductance so that the frequency response of the double tuned circuit will be substantially constant over the 10 kc. frequency range of the oscillator.

While I have described above the principles of my invention in connection with specific apparatus, it is to be clearly understood that this description is made by way of example only and not as a limitation to the scope of my invention as set forth in the objects thereof and in the accompanying claims.

I claim:

1. An oscillator for selective operation over a range of frequencies comprising an electron discharge device which includes a cathode, an anode, a control grid, and a screen grid, a tank circuit comprising an inductance and capacitance, means to couple said tank circuit between said cathode and said control grid, a filter circuit, means to couple said filter circuit between said anode and said screen grid, a plurality of inductance increments, switching means for coupling said inductance increments additively in series with said tank circuit inductance whereby the oscillator frequency is changed by each switching step an amount corresponding to each inductance increment added and a variable inductance coupled in series with said inductive increments to selectively vary said oscillator frequency between the frequencies of said switching steps.

2. An oscillator for selective operation over a range of frequencies comprising an electron discharge device which includes a cathode, an anode, a screen grid and a control grid, a tank circuit having an inductance and capacitance, means to couple said tank circuit between said cathode and said control grid, a plurality of equal inductance increments, a first switching means for coupling said inductance increments additively in series with said tank circuit inductance, a second switching means coordinated with the operative position of said first switching means to couple in parallel relation to said tank circuit capacitance an amount of capacitance for each increment addition of inductance to change the oscillator frequency a given amount, a plurality of additional equal inductance increments, third switching means for coupling said additional inductance increments additively in series with said tank circuit inductance to change the oscillator frequency in equal sub-steps of frequency between said frequency steps, a variable inductance to selectively vary the oscillating frequency between said sub-steps of frequency, a filter circuit coupled between said screen grid and said anode whereby undesirable frequency responses are eliminated from the output.

3. An oscillator for selective operation over a range of frequencies comprising an electron discharge device which includes a cathode, an anode, a control grid, a tank circuit resonant at 100 kc. comprising an inductance, means to couple said tank circuit between said cathode and said control grid, ten equal inductance increments, a decade switch for coupling said inductance increments additively in series with said tank circuit inductance, a second decade switch gauged with said first decade switch to couple in parallel relation to said tank circuit capacitance an amount of capacitance for each increment addition of inductance to reduce the oscillator frequency 1 kc. for each inductance increment added, ten additional equal inductance increments each having one-tenth the inductance of a first-mentioned inductance increment, a third decade switch to couple additively in series said additional inductance increments to reduce the oscillator frequency 100 cycles per second for each additional increment added, ten supplemental equal inductance increments each having one-tenth the inductance of an additional inductance increment, a fourth decade switch to couple additively in series said supplemental inductance increments to reduce the oscillator frequency 10 cycles per second for each supplemental inductive increment added.

4. An oscillator for selective operation over a range of frequencies comprising an electron discharge device which includes a cathode, an anode, a control grid and a screen grid, a tank circuit resonant at 100 kc. comprising an inductance, means to couple said tank circuit between said cathode and said control grid, ten equal inductance increments, a decade switch for coupling said inductance increments additively in series with said tank circuit inductance, a second decade switch gauged with said first decade switch to couple in parallel relation to said tank circuit capacitance an amount of capacitance for each increment addition of inductance to reduce the oscillator frequency 1 kc. for each inductance increment added, and a filter circuit coupled between said screen grid and said anode to eliminate from the filter output all frequencies not between 90 and 100 kc.

5. An oscillator according to claim 4, which further includes a variable inductance to vary the oscillator frequency over a 10 cycle range.

References Cited in the file of this patent

UNITED STATES PATENTS

| | | |
|---|---|---|
| 1,586,580 | Schelleng | June 1, 1926 |
| 2,137,266 | Case | Nov. 22, 1938 |
| 2,150,562 | Reid | Mar. 14, 1939 |
| 2,159,105 | Reid | May 23, 1939 |
| 2,209,959 | Chittick et al. | Aug. 6, 1940 |
| 2,209,982 | Kirkwood | Aug. 6, 1940 |
| 2,295,173 | Hoffman et al. | Sept. 8, 1942 |
| 2,617,035 | Janssen | Nov. 4, 1952 |